US011108404B1

(12) United States Patent
Li

(10) Patent No.: US 11,108,404 B1
(45) Date of Patent: Aug. 31, 2021

(54) LOW NOISE INTEGRATED CIRCUIT TECHNIQUES

(71) Applicant: Analog Devices, Inc., Norwood, MA (US)

(72) Inventor: Hongxing Li, Andover, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/935,920

(22) Filed: Jul. 22, 2020

(51) Int. Cl.
*H03M 1/08* (2006.01)
*H03M 1/34* (2006.01)

(52) U.S. Cl.
CPC ........... *H03M 1/0863* (2013.01); *H03M 1/34* (2013.01)

(58) Field of Classification Search
CPC .............................. H03M 1/0863; H03M 1/34
See application file for complete search history.

(56) References Cited

U.S. PATENT DOCUMENTS

| 5,182,446 | A | 1/1993 | Tew |
| 6,803,555 | B1 | 10/2004 | Parrish et al. |
| 6,917,027 | B2 | 7/2005 | Krymski |
| 6,970,038 | B2 | 11/2005 | Chandrasekaran |
| 7,298,151 | B2 | 11/2007 | Kapusta, Jr. et al. |
| 8,352,030 | B2 | 1/2013 | Denison |
| 8,508,257 | B2 | 8/2013 | Kapusta et al. |
| 9,106,208 | B2 | 8/2015 | Visconti et al. |
| 9,525,426 | B2 | 12/2016 | Stojanovic et al. |
| 9,780,129 | B2 | 10/2017 | Eshel |
| 10,128,859 | B1* | 11/2018 | Rajasekhar ......... H03M 1/0607 |
| 10,462,397 | B1* | 10/2019 | Eshel ................... G11C 27/026 |
| 2009/0273386 | A1 | 11/2009 | Korobeynikov et al. |
| 2009/0273392 | A1 | 11/2009 | Korobeynikov et al. |

FOREIGN PATENT DOCUMENTS

| CN | 104485897 B | 8/2017 |
| EP | 1741189 B1 | 2/2013 |
| WO | WO-1998045798 A1 | 10/1998 |
| WO | WO-2007109506 A2 | 9/2007 |

OTHER PUBLICATIONS

Kapusta, Ron, et al., "Sampling Circuits That Break the kT/C Thermal Noise Limit", IEEE Journal of Solid-State Circuits, 49(8), (Aug. 2014), 8 pgs.
Kapusta, Ron, et al., "Sampling Circuits That Break the kT/C Thermal Noise Limit", IEEE preprint, (2013), 6 pgs.
Rajasekhar, Sanjay, et al., "Low Noice Analog-to-Digital Converter", U.S. Appl. No. 16/570,433, Application filed Sep. 13, 2019, 43 pgs.

* cited by examiner

*Primary Examiner* — Khai M Nguyen
(74) *Attorney, Agent, or Firm* — Schwegman Lundberg & Woessner, P.A,

(57) ABSTRACT

The techniques of this disclosure can cancel or reduce the kT/C noise directly before the gain stage. The effect of the kT/C noise can be greatly reduced, allowing both lower noise conversion and smaller sampling capacitors, which can reduce the die area and reduce the power consumption of the ADC.

25 Claims, 16 Drawing Sheets

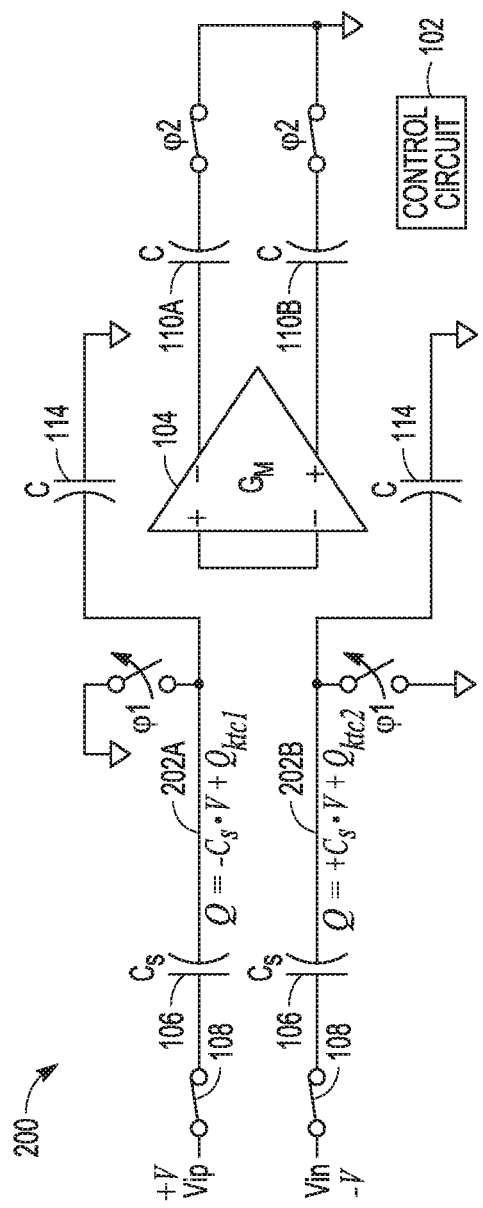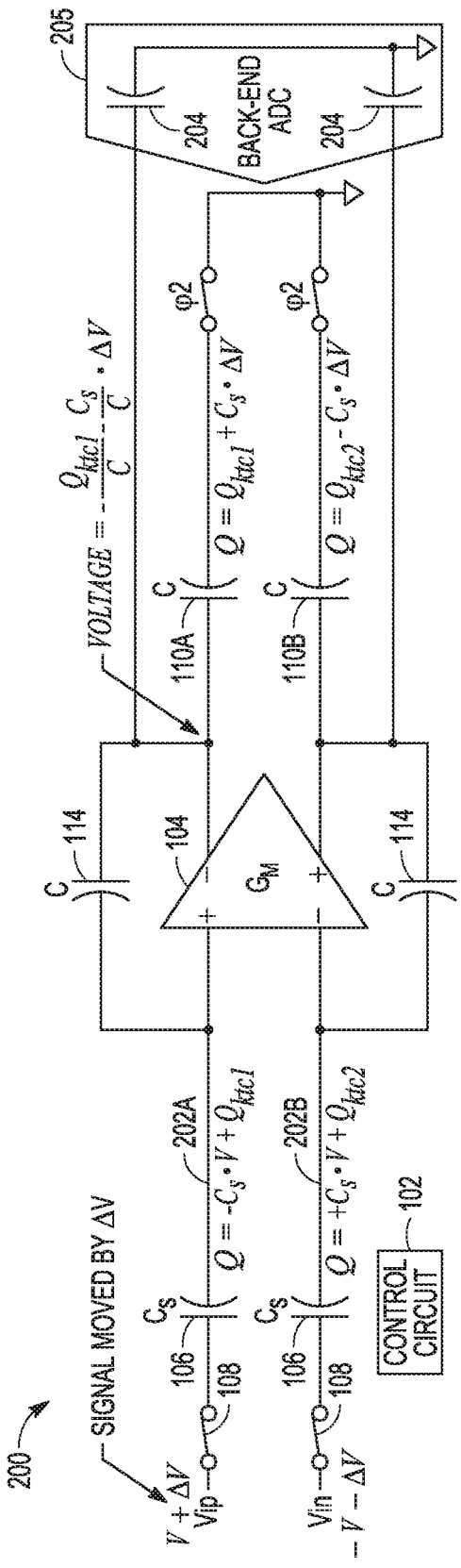

LOW NOISE INTEGRATED CIRCUIT TECHNIQUES

FIELD OF THE DISCLOSURE

This document pertains generally, but not by way of limitation, to integrated circuits.

BACKGROUND

One problem associated with sampling circuits, such as switched capacitor circuits, is that each time a signal is sampled, thermal noise is also sampled. Thermal noise arises due to the random motion of free electrons in a conducting medium. Each free electron inside the medium is in motion due to its thermal energy. Because capacitors are noiseless devices, the capacitors of sampling circuits do not have any thermal noise associated with them. However, thermal noise will be present in the switch used for the sample operation or in an amplifier used for the sample operation. The sampled thermal noise introduces undesired disturbances into the sampled signal that adversely affect overall accuracy and/or resolution, for example.

The integrated thermal noise power of a sampling circuit is the product of the thermal noise spectral density and the thermal noise bandwidth of the circuit. In the case where a switch is used in connection with a sample and hold operation, the thermal noise spectral density and the thermal noise bandwidth are calculated in part based on the on-resistance of the switch. In the case where an amplifier is used in connection with the sample and hold operation, the thermal noise spectral density and the thermal noise bandwidth are calculated in part based on the transconductance of the amplifier.

In conventional sampling circuits, the spectral density and the bandwidth of the thermal noise are dominated by the same element, for example the switch or the amplifier, of the sampling circuit. When the integrated thermal noise power is calculated, the result is kT/C, where k is Boltzmann's constant, T is the ambient temperature, and C is the capacitance of the sampling capacitor, because the on-resistance of the switch or the transconductance of the amplifier cancels in the spectral density and bandwidth terms. Although the capacitance of the sampling capacitor selected can be increased to reduce the sampled thermal noise, large capacitance is undesirable because larger capacitors in a sampling circuit consume more power and space.

SUMMARY OF THE DISCLOSURE

Noise sources in a circuit can include kT/C sampling noise from a capacitor digital-to-analog converter (DAC) circuit, noise coupling on to sampling capacitors from digital circuits and amplifier thermal noise. In conventional analog-to-digital converter (ADC) architectures, kT/C sampling noise is inversely proportional to the size of the sampling capacitors; larger sampling capacitors can produce less noise. However, larger sampling capacitors can be difficult to drive and can physically occupy significant die area.

The techniques of this disclosure can cancel or reduce the kT/C noise directly before the gain stage. This is in contrast to other techniques that can cancel or reduce the kT/C noise indirectly after the gain stage. The effect of the kT/C noise can be greatly reduced, allowing both lower noise conversion and smaller sampling capacitors, which can reduce the die area and reduce the power consumption of the ADC.

In some aspects, this disclosure is directed to an integrated circuit configured to reduce or cancel a sampled noise during a sampling phase, the integrated circuit comprising: a sampling capacitor configured to store a voltage during the sampling phase, wherein the noise is also stored on the sampling capacitor; an amplifier circuit having an input and an output, wherein the input is configured to be coupled to the sampling capacitor, and wherein the amplifier circuit is configured to transfer the sampled noise stored on the sampling capacitor; a noise cancellation capacitor configured to be coupled to the output of the amplifier circuit; and a control circuit configured to control switch operation to couple the noise cancellation capacitor to the sampling capacitor to reduce or cancel the sampled noise.

In some aspects, this disclosure is directed to a method to reduce or cancel a sampled noise during a sampling phase, the method comprising: storing, during a first phase, a voltage during the sampling phase, wherein the sampled noise is also stored on a sampling capacitor; transferring, during a second phase, the sampled noise stored on the sampling capacitor to a noise cancellation capacitor; and coupling, during a third phase, the noise cancellation capacitor to the sampling capacitor to reduce or cancel the sampled noise.

In some aspects, this disclosure is directed to an integrated circuit configured to reduce or cancel a sampled noise during a sampling phase, the integrated circuit comprising: means for storing, during a first phase, a voltage during the sampling phase, wherein the sampled noise is also stored on a sampling capacitor; means for transferring, during a second phase, the sampled noise stored on the sampling capacitor to a noise cancellation capacitor; and means for coupling, during a third phase, the noise cancellation capacitor to the sampling capacitor to reduce or cancel the sampled noise.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 2B is a simplified schematic diagram of the circuit of FIG. 2A during a second portion of the first phase.

FIG. 2C is a simplified schematic diagram of the circuit of FIG. 2A during a first portion of the second phase.

DETAILED DESCRIPTION

Noise sources in a circuit can include kT/C noise of a sampling capacitor, noise coupling on to sampling capacitors from digital circuits and amplifier noise. Also, charge injection from mismatch in sample switches can cause offsets. The kT/C sampling noise is inversely proportional to the size of the sampling capacitors; larger sampling capacitors can produce less noise. However, larger sampling capacitors can be difficult to drive and can physically occupy significant die area.

By using various techniques of this disclosure, the kT/C sampling noise can be largely canceled or reduced. As a result, the size of the sampling capacitors can be greatly reduced, while still achieving significantly improved noise performance and power efficiency for the overall converter.

As described in more detail below, the techniques of this disclosure can be summarized in the following three non-limiting steps. First, a sampling capacitor having a size of C can sample an input signal (or a constant bias voltage) and the kT/C noise charge can be frozen by opening a right-hand side (RHS) sampling switch. The left-hand side (LHS) switch can still receive the input signal (or the constant bias voltage). Second, the RHS of the sampling capacitor can be coupled to an input of a gain stage having a gain of A. A noise cancellation capacitor having a size of C/A can be coupled to the output of the gain stage. Now, the moved input signal and kT/C noise can be amplified and sampled by the noise cancellation capacitor. Due to its sizing, the noise cancellation capacitor stores the moved input signal component and the kT/C noise charge. Third, the noise cancellation capacitor can be coupled to the sampling capacitor. The two equally sized kT/C noise charges are canceled (or at least reduced) with each other, and the charge due to the moved input signal is also aggregated with the first sampled signal charge. So, the combined total charge represents the signal when the noise cancellation capacitor takes the sample in the second step and, in some examples, it can be further processed, such as using an ADC.

In this manner, the techniques of this disclosure can cancel or reduce the kT/C noise by directly removing the noise charge on the sampling capacitors before the gain stage. This is in contrast to other techniques that can cancel or reduce the kT/C noise indirectly after the gain stage.

Figure 1:
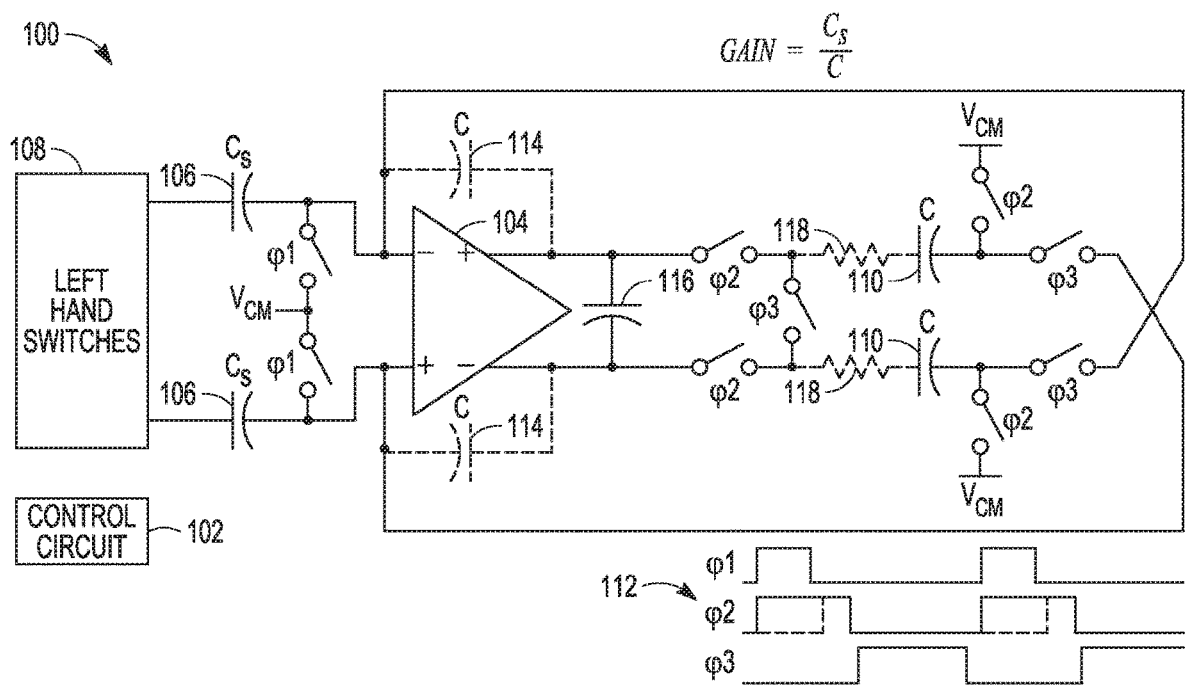
FIG. 1 is a simplified schematic diagram of an example of a circuit that can implement various techniques of this disclosure.

FIG. 1 is a simplified schematic diagram of an example of a circuit that can implement various techniques of this disclosure. The circuit 100 in FIG. 1, e.g., an integrated circuit, can include a control circuit 102 configured to control switch operation, and an amplifier circuit 104 having inverting and non-inverting inputs coupled to corresponding right-hand side plates of sampling capacitors 106 (each with capacitance $C_S$). In some examples, the amplifier circuit 104 can be an auto-zero amplifier circuit.

Left-hand side switches 108 can be coupled to left-hand side plates of the sampling capacitors 106. When the control circuit 102 closes the left-hand side switches 108, such as during a sampling phase, the sampling capacitors 106 can receive and store a voltage.

The circuit 100 can include a number of additional switches, labeled φ1, φ2, and φ3, which are controlled by clocks φ1, φ2, and φ3, respectively. The high state of the clock means the corresponding switches are turned on, and the low state of the clock means the corresponding switches are turned off. The φ1 switches can couple the inverting and non-inverting inputs of the amplifier to a common mode voltage $V_{CM}$. The circuit 100 can include noise cancellation capacitors 110 (each with capacitance C) that can be coupled to inverting and non-inverting outputs of the amplifier circuit 104. In particular, left-hand side plates of the noise cancellation capacitors 110 can be coupled to inverting and non-inverting outputs of the amplifier circuit 104 using a first pair of φ2 switches and right-hand side plates of the noise cancellation capacitors 110 can be coupled to the common mode voltage $V_{CM}$ using a second pair of φ2 switches. The right-hand side plates of the noise cancellation capacitors 110 can also be coupled to φ3 switches, which can couple the noise cancellation capacitors 110 to the corresponding sampling capacitors 106 to cancel or reduce a sampled noise.

The control circuit 102 can control the operation of the φ1, φ2, and φ3 switches using corresponding φ1, φ2, and φ3 clocks, which are shown graphically at 112. The first phase is when φ1 is in the high state, which can represent a sampling phase of the sampling capacitors 106. The second phase is after φ1 transitions to the low state and before φ2 transitions to the low state. The second phase can represent a transfer phase in which the sampled noise stored on the sampling capacitors 106 can be amplified and sampled by the corresponding noise cancellation capacitor 110. The third phase is after φ2 transitions to the low state and when φ3 is the high state. The third phase represents a cancellation phase in which the noise cancellation capacitors can be coupled to the corresponding sampling capacitor to reduce or cancel the sampled noise. In some examples, the sampling capacitor is coupled to an input signal, such as $V_{IP}$, $V_{IN}$, during at least one of the first, second, and third phases.

As seen at 112, in some examples, the control circuit 102 can close both the φ1 and φ2 switches, open the φ1 switches, open the φ2 switches after the φ1 switches, close the φ3 switches, and then open the φ3 switches. In other examples, the control circuit 102 can close the φ2 switches after the φ1 switches are opened, as shown by the dashed line in the φ2 clock, such that the φ2 switches do not overlap with the φ1 switches. In other examples, the second pair of φ2 switches is turned off slightly before the first pair of φ2 switches to reduce the signal dependent charge injection error on the noise cancellation capacitors 110. This is called bottom plate sampling and is a technique to sample voltage signals to capacitors.

The circuit 100 can include one or more optional components, which are shown in dashed line. For example, the amplifier circuit 104 can be arranged in a negative-feedback configuration, such as by using optional feedback capacitors 114 (each with capacitance C). In some implementations, the negative-feedback configuration can control an overall gain of the integrated circuit. For example, by using the negative-feedback configuration shown in FIG. 1, the gain of the circuit 100 can be $C_S/C$. In other examples, the amplifier circuit 104 can be arranged without feedback in an open loop configuration.

Optionally, the circuit 100 can include a capacitor 116 coupled between the outputs of the amplifier circuit 104. Optionally, the circuit 100 can include resistors 118 coupled to the left-hand side plates of the noise cancellation capacitors 110.

Figure 12:
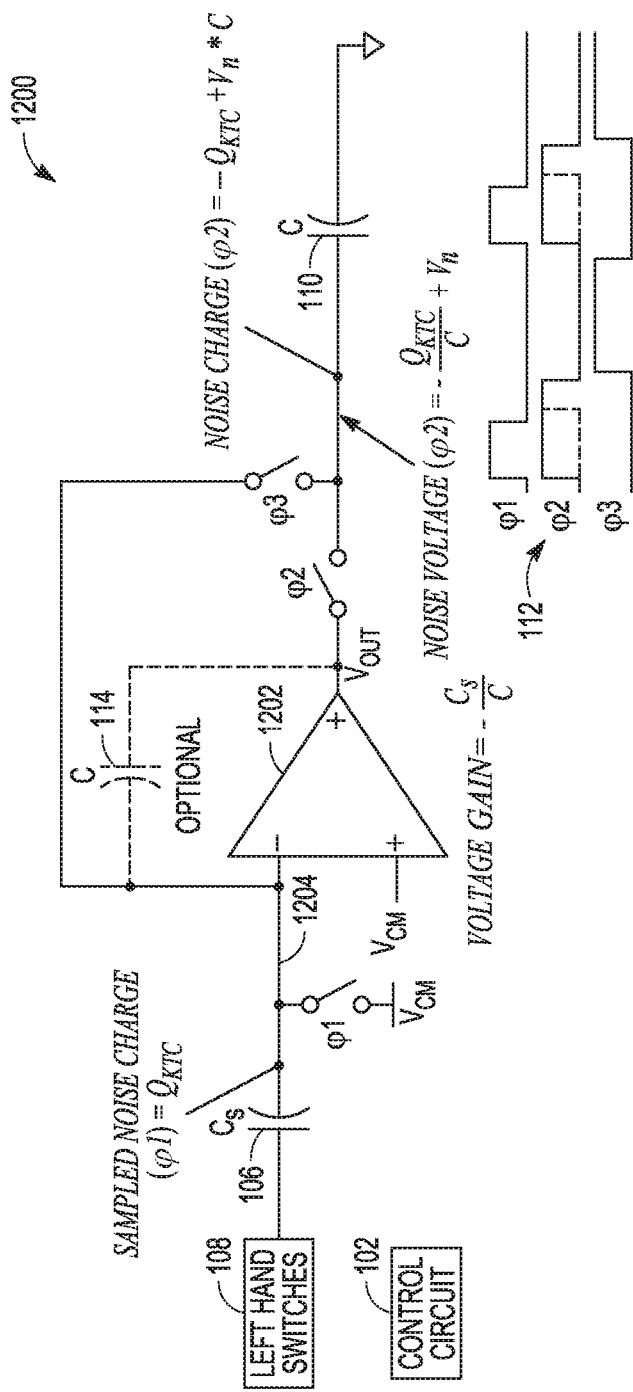
FIG. 12 is a simplified schematic diagram of an example of a single-ended circuit that can implement various techniques of this disclosure.
Figure 13:
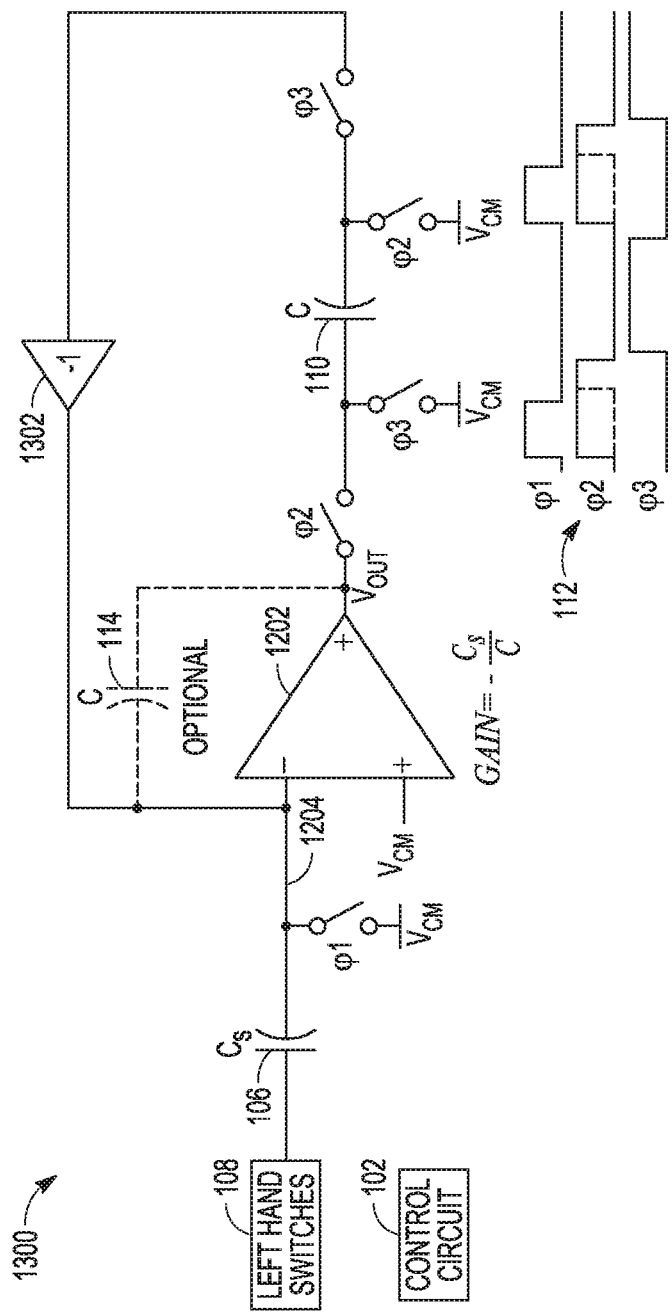
FIG. 13 is a simplified schematic diagram of another example of a single-ended circuit that can implement various techniques of this disclosure.
Figure 14:
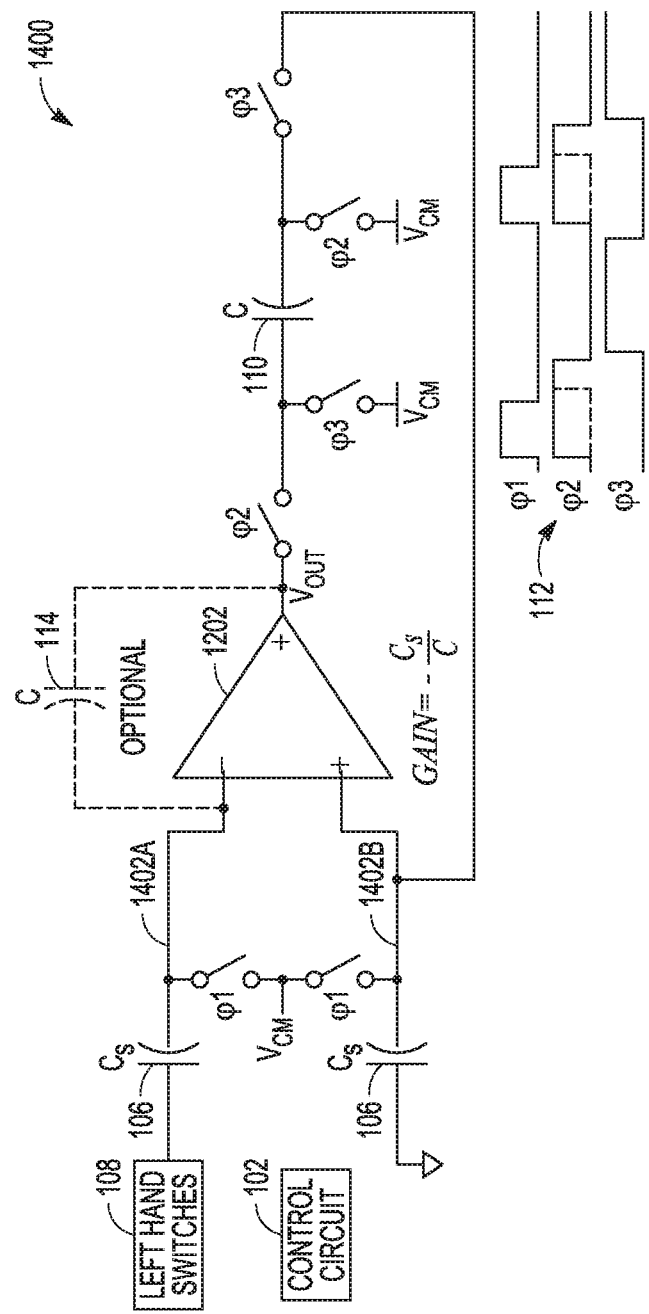
FIG. 14 is a simplified schematic diagram of another example of a single-ended circuit that can implement various techniques of this disclosure.

Three important events of the noise cancellation techniques of this disclosure can correspond to the switch operation shown at 112. At the falling edge of the φ1 clock, the sample noise is frozen. At the falling edge of the φ2 clock, the sample noise is copied. During the high state of the 93 clock, the sample noise is canceled. These events are described in more detail below with respect to FIGS. 2A-2F. It should be noted that although the circuit 100 is shown in a differential configuration, the noise cancellation techniques are also applicable to single-ended configurations, as shown in FIGS. 12-14.

Figure 6:
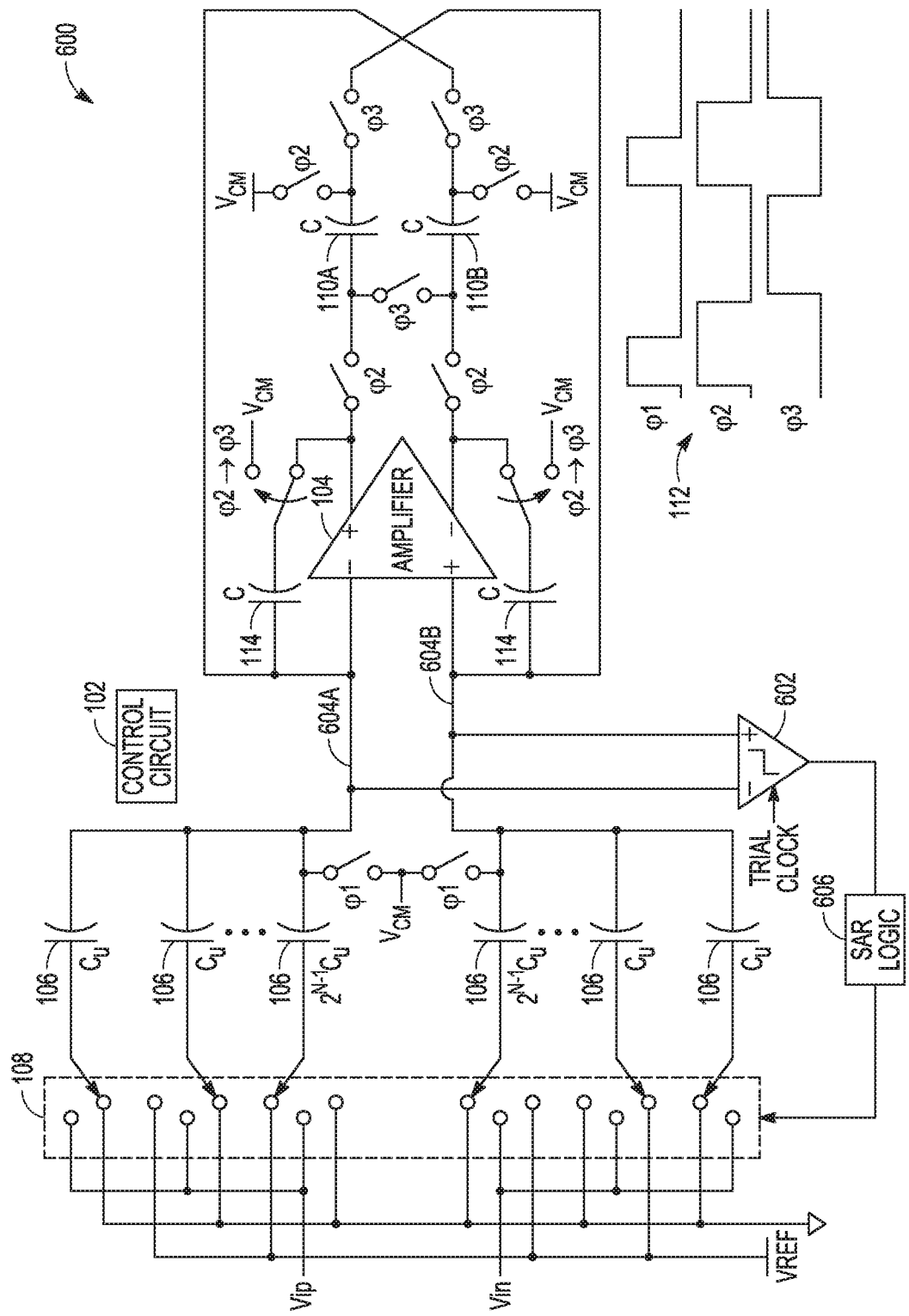
FIG. 6 is a simplified schematic diagram of an example of a single stage SAR ADC circuit that can implement various techniques of this disclosure.
Figure 8:
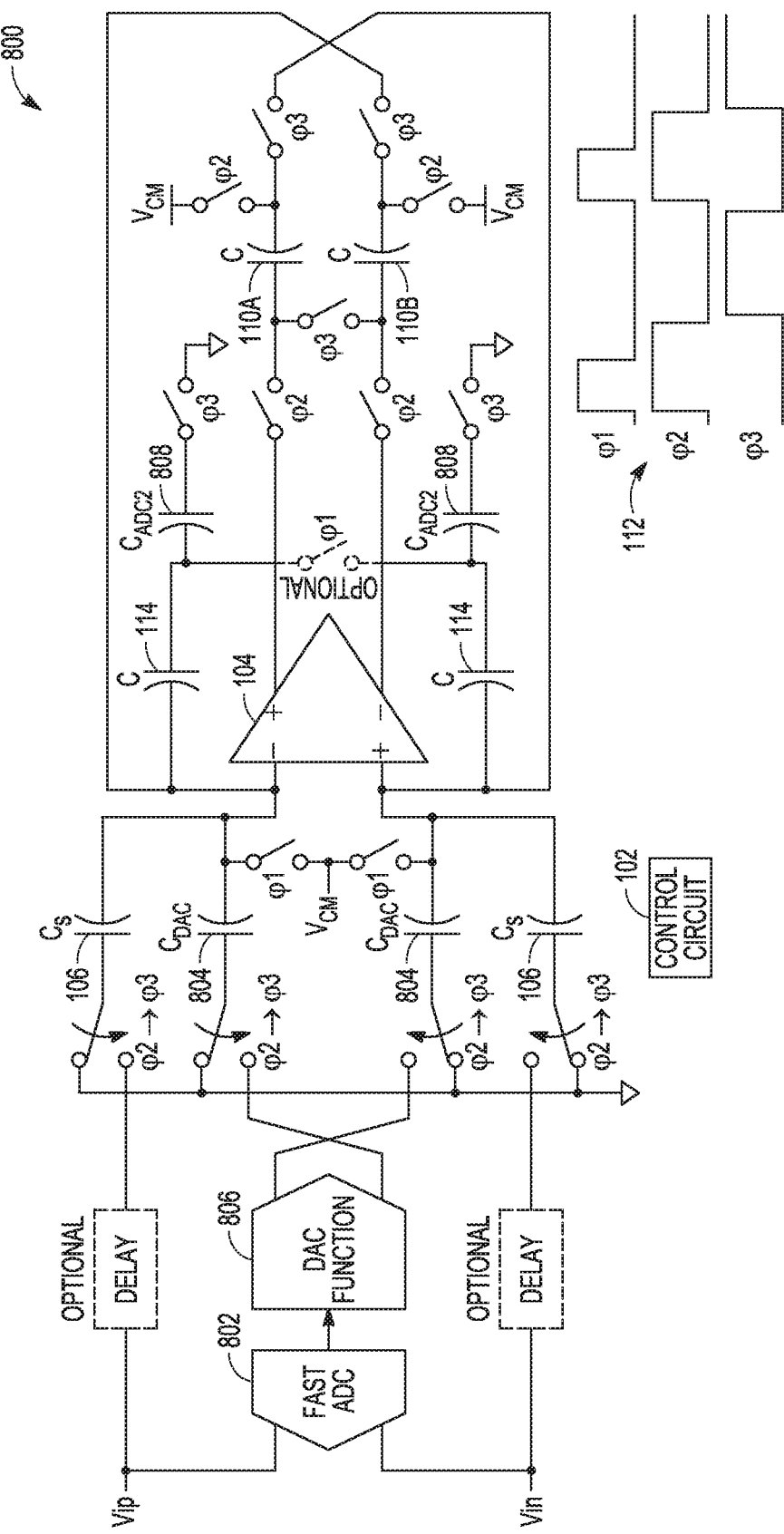
FIG. 8 is a simplified schematic diagram of another example of a first stage ADC circuit that can implement various techniques of this disclosure.
Figure 10:
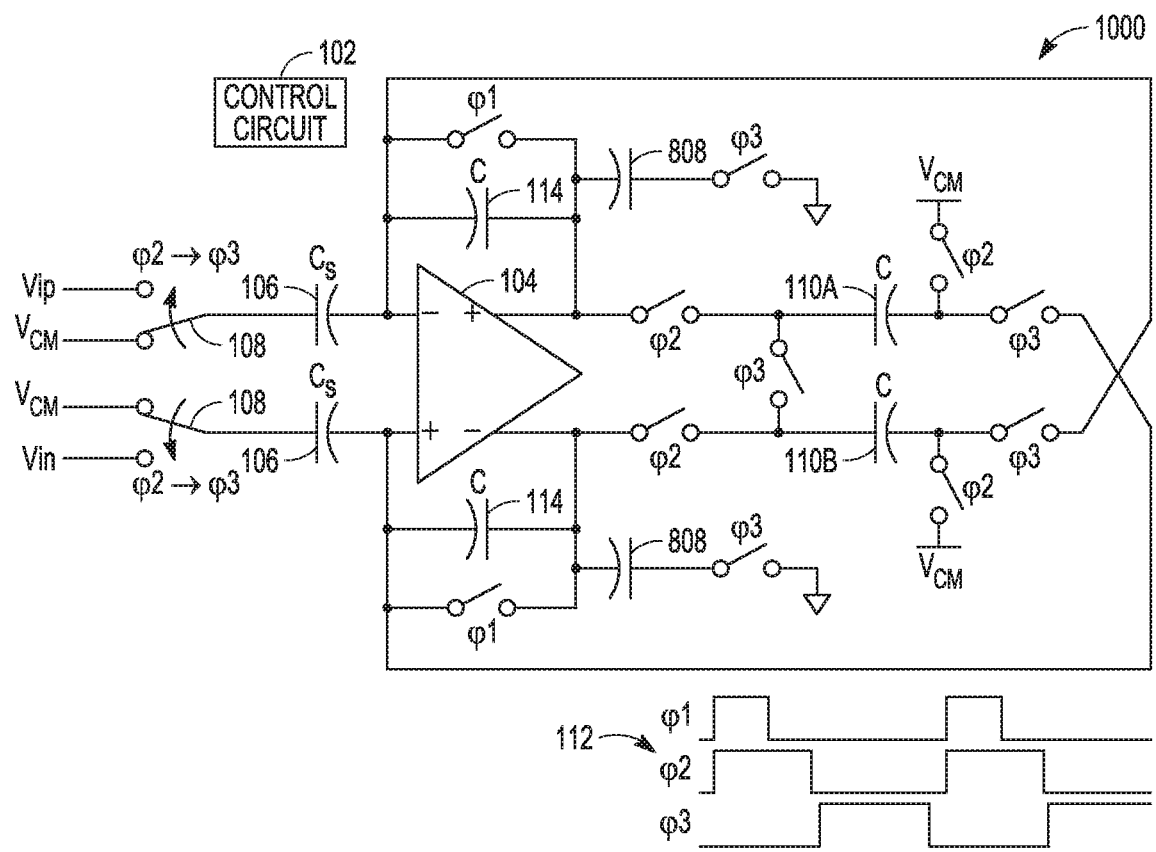
FIG. 10 is a simplified schematic diagram of an example of a gain stage circuit that can implement various techniques of this disclosure.
Figure 11:
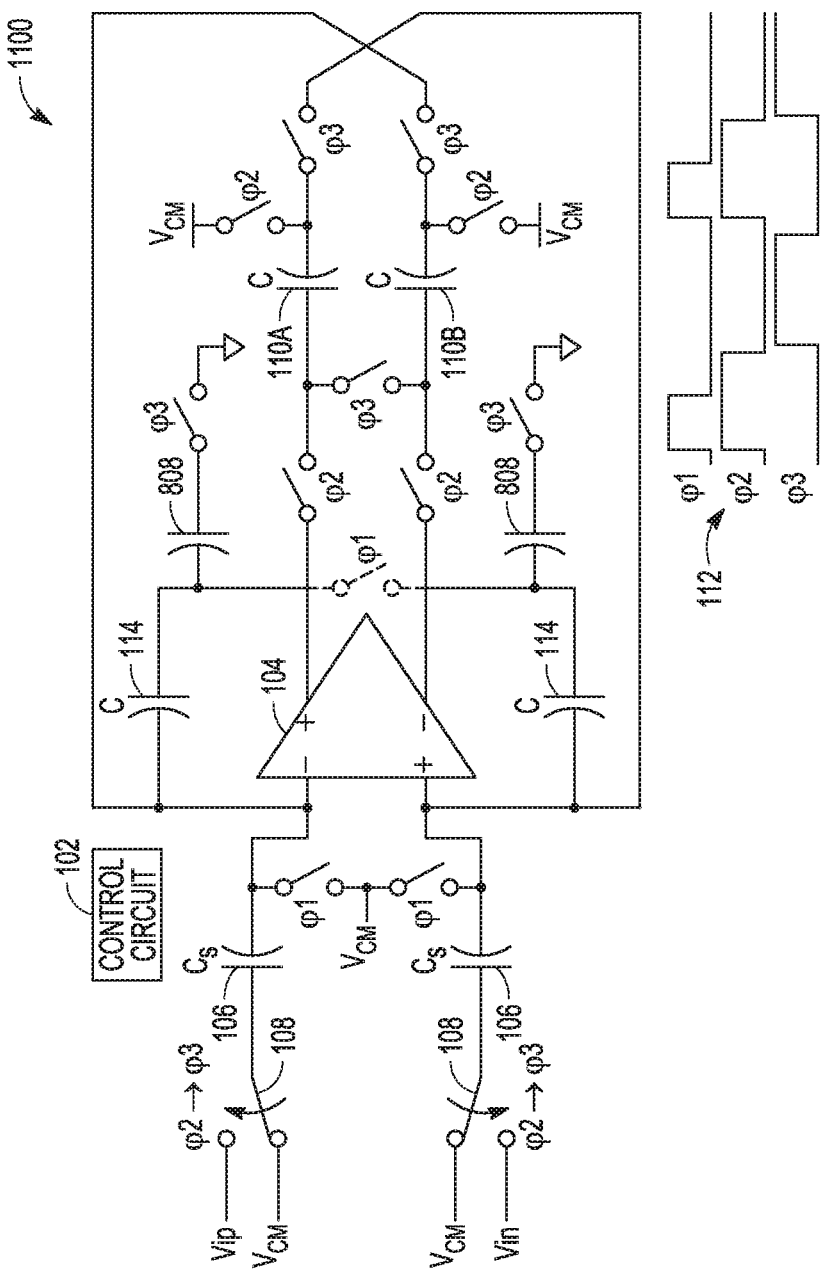
FIG. 11 is a simplified schematic diagram of another example of a gain stage circuit that can implement various techniques of this disclosure.

In some examples, the noise cancellation circuits shown in this disclosure can form part of an ADC, such as shown in FIGS. 6 and 8. In some examples, the noise cancellation circuits shown in this disclosure can form part of a gain stage, such as shown in FIGS. 10 and 11.

Figure 2A:
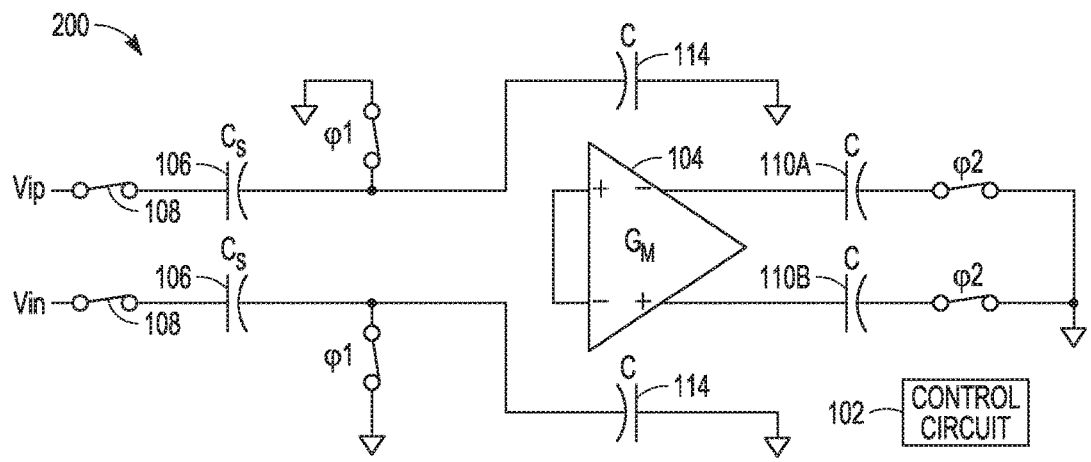
FIG. 2A is a simplified schematic diagram of an example of a circuit during a first portion of a first phase that can implement various techniques of this disclosure.

FIG. 2A is a simplified schematic diagram of an example of a circuit 200 during a first portion of a first phase that can implement various techniques of this disclosure. During the first portion of the first phase, the left-hand switches 108 are closed, the φ1 switches are closed, and the second pair of φ2 switches are closed. For simplicity, the first pair of φ2 switches and the φ3 switches are not depicted. The example of a circuit shown in FIG. 2A, e.g., an integrated circuit, includes capacitors 114, which can provide gain when connected to the amplifier circuit 104 in a negative-feedback configuration, such as shown in FIG. 2C. During the first portion of the first phase, an input signal (or constant bias voltage) is acquired.

FIG. 2B is a simplified schematic diagram of the circuit 200 of FIG. 2A during a second portion of the first phase. During the second portion of the first phase, the control circuit 102 can open the φ1 (sampling) switches to sample a signal (or constant bias voltage). In addition to sampling the signal (or constant bias voltage), opening the φ1 (sampling) switches can sample the corresponding kT/C noise charges $Q_{KTC1}$ and $Q_{KTC2}$. As such, a charge of $Q=-C_S*V+Q_{KTC1}$ is stored on the top plate node 202A, and a charge of $Q=+C_S*V+Q_{KTC2}$ is stored on the top plate node 202B.

FIG. 2C is a simplified schematic diagram of the circuit of FIG. 2A during a first portion of the second phase. During the first portion of the second phase, the control circuit 102 can control switch operation to connect the feedback capacitors 114 between corresponding inputs and outputs of the amplifier circuit. In addition, the control circuit 102 can control switch operation to connect the input terminals of the amplifier circuit 104 to corresponding top plate nodes 202A, 202B.

The sampling capacitors 106 can be coupled to the signal (e.g., $V_{IP}$, $V_{IN}$) during at least one of the three phases. As seen in the example shown in FIG. 2C, the left-hand switches 108 are still connected, so the signal is still feeding through to the sampling capacitors 106. The signal has moved from the original voltage V by ΔV, or V+ΔV.

In some examples, the circuit 200 of FIG. 2C can form part of a pipelined ADC, such as a pipelined successive approximation routine (SAR) ADC. In such a configuration, the amplifier circuit 104 can be a residue amplifier. As shown in FIG. 2C, a residue amplifier output voltage be equal to $-(Q_{KTC1}/C)-(C_S/C)*\Delta V$. Each noise cancellation capacitor 110A, 110B can store a charge. In particular, the noise cancellation capacitor 110A can store a charge of $Q=Q_{KTC1}+C_S*\Delta V$ and the noise cancellation capacitor 110B can store a charge of $Q=Q_{KTC2}-C_S*\Delta V$.

In the example shown in FIG. 2C, additional load capacitors 204 can be used to reduce the noise of the amplifier circuit 104. In some examples, the load capacitors 204 can be input sampling capacitors of a backend ADC 205, such as but not limited to a second stage in a two-stage pipelined ADC.

Figure 2D:
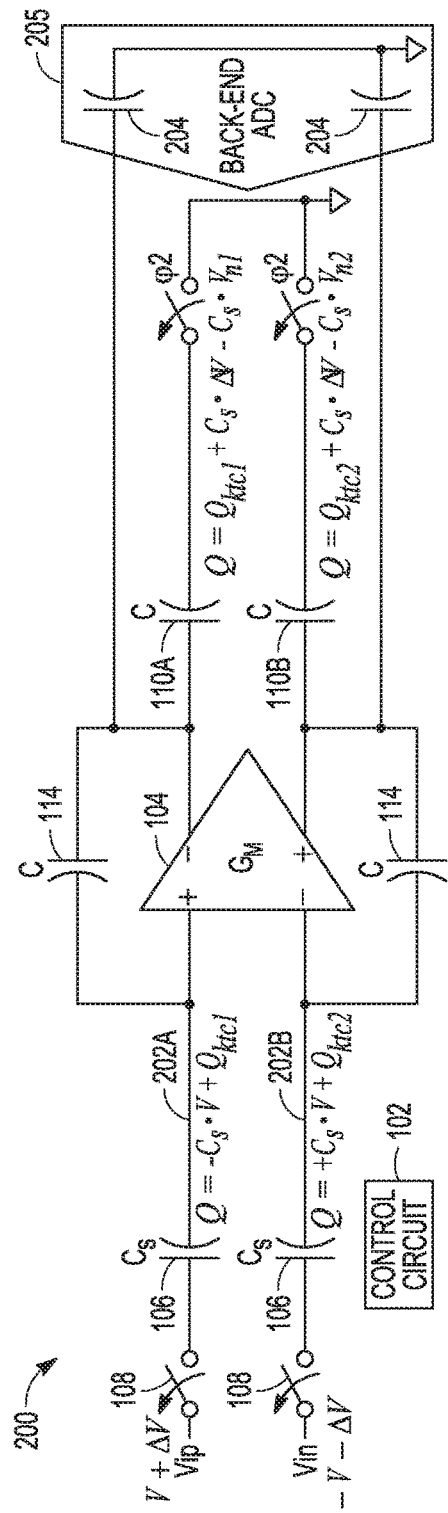
FIG. 2D is a simplified schematic diagram of the circuit of FIG. 2A during a second portion of the second phase.

FIG. 2D is a simplified schematic diagram of the circuit of FIG. 2A during a second portion of the second phase. During the second portion of the second phase, the control circuit 102 can open the left-hand switches 108 and the <φ2 switches, which samples the moving signal, the kT/C noise, and the amplifier noise onto the noise cancellation capacitors 110A, 110B. Every time a sample is taken, some thermal noise is also sampled. Here, the two additional sampled thermal noise terms are shown as $V_{N1}$ and $V_{N2}$. The noise cancellation capacitor 110A stores a charge of $Q=Q_{KTC1}+(C_S*\Delta V)-(C*V_{N1})$ and the noise cancellation capacitor 110B stores a charge of $Q=Q_{KTC2}-(C_S*\Delta V)-(C*V_{N2})$.

Figure 2E:
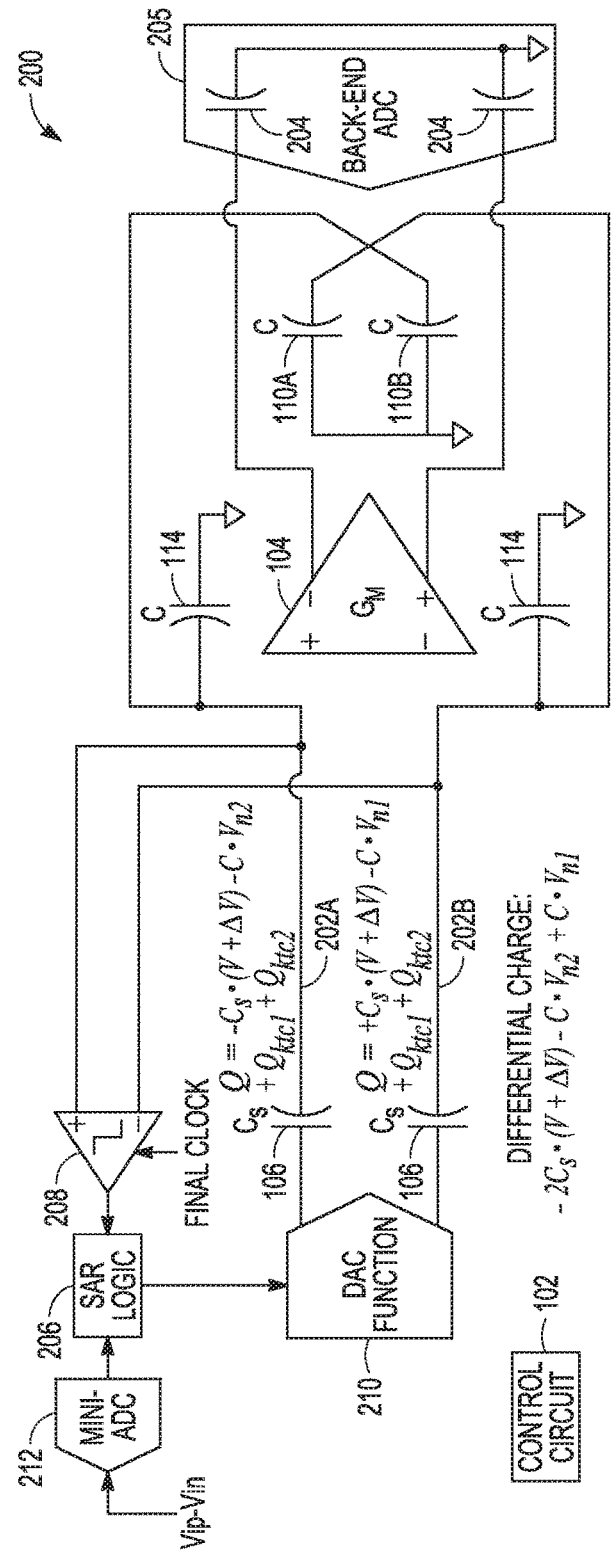
FIG. 2E is a simplified schematic diagram of the circuit of FIG. 2A during a first portion of the third phase.

FIG. 2E is a simplified schematic diagram of the circuit of FIG. 2A during a first portion of the third phase. As indicated above, the circuit 200 can form part of a pipelined ADC, such as a pipelined SAR ADC that includes a SAR logic circuit 206 coupled to a comparator circuit 208. In addition, the circuit 200 can include a DAC function circuit 210 and, in some examples, a mini-ADC 212, which can improve the speed of the bit trial process and/or mitigate high voltage swing issues, for example. The DAC function circuit 210 is a simplified here to illustrate an important principle. When implementing these techniques, there are many ways to produce the DAC function. For example, the capacitor 106 can be a binary array of multiple capacitors (C/2, C/4, . . . , C/N, C/N), where N is the number of bits of the DAC function. The last C/N capacitor can sample the signal but connect to a constant voltage when the capacitor 106 is configured as a DAC. The right-hand side of the capacitors can be shorted together and the left-hand sides can be driven to either a high voltage or a low voltage depending on a DAC code to produce an equivalent DAC voltage.

During the first portion of the third phase, the control circuit 102 can control switch operation to disconnect the amplifier circuit 104 from the feedback capacitors 114 (if present) and the capacitors 106 in advance of the bit trials. In addition, the control circuit 102 can control switch operation to disconnect the noise cancellation capacitors 110A, 110B from the output of the amplifier circuit 104, and can control switch operation to connect the right-hand side plates of the noise cancellation capacitors 110A, 110B to the right-hand side plates of corresponding sampling capacitors 106. In this manner, the control circuit 102 can control switch operation to couple the first noise cancellation capacitor 102A to a sampling capacitor 106 and the second noise cancellation capacitor 102B to the other sampling capacitor 106 to cancel or reduce the sampled noise.

After connecting the right-hand side plates of the noise cancellation capacitors 110A, 110B to the right-hand side plates of corresponding sampling capacitors 106, the charge stored on the top plate node 202A is $Q=-C_S*(V+\Delta V)-(C*V_{N2})+Q_{KTC1}+Q_{KTC2}$, and the charge stored on the top plate node 202B is $Q=+C_S*(V+\Delta V)-(C*V_{N1})+Q_{KTC1}+Q_{KTC2}$. Due to the differential configuration, the two charges are subtracted, resulting in a differential charge of $Q=-2C_S*(V+\Delta V)-(C*V_{N2})+(C*V_{N1})$. The resulting differential charge includes the signal portion and the thermal noise terms, and the kT/C noise terms $Q_{KTC1}$ and $Q_{KTC2}$ are canceled. Although these thermal noise terms were introduced during the operation shown in FIG. 2D, the thermal noise can be much smaller than the original kT/C noise. As such, the techniques of this disclosure can cancel the dominant kT/C noise, but introduce a much smaller noise term.

The control circuit 102 can connect the load capacitors 204 to virtual ground and then the SAR logic circuit can begin performing the bit trials.

Figure 2F:
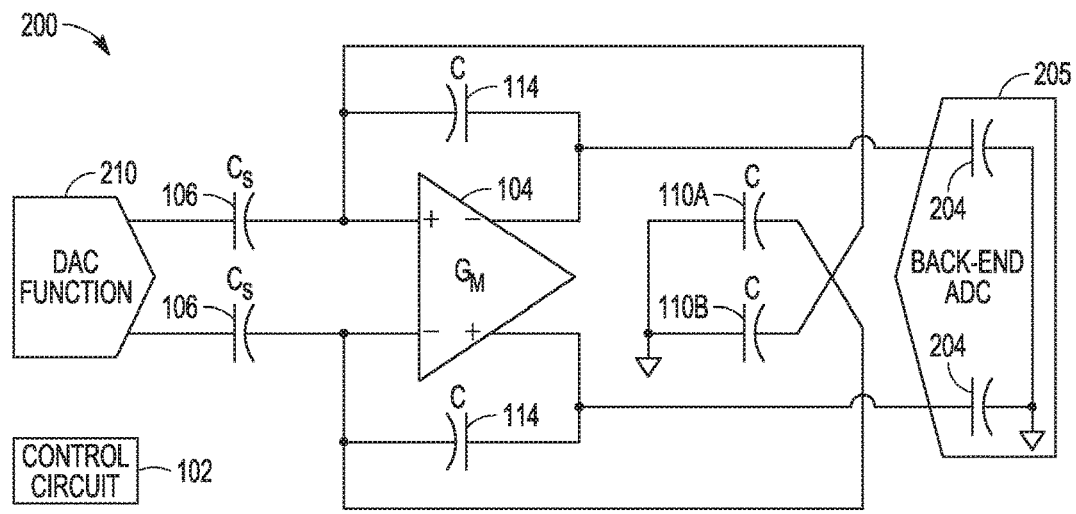
FIG. 2F is a simplified schematic diagram of the circuit of FIG. 2A during a second portion of the third phase.

FIG. 2F is a simplified schematic diagram of the circuit of FIG. 2A during a second portion of the third phase. During the second portion of the third phase, the control circuit 102 can control switch operation to connect the amplifier circuit 104 to the feedback capacitors 114 (if present). The control circuit 102 can connect the left-hand side plates of the sampling capacitors 106 to the DAC function circuit 210.

The DAC function circuit 210 stores the DAC signal, which is a close representation of the input signal. The amplifier circuit 104 can amplify the residue voltage between the DAC signal and the input signal $V+\Delta V$. The backend ADC circuit 205 can take a sample of the amplified residue voltage and convert the sampled residue voltage to a digital representation.

It should be noted that a different residue amplifier circuit and/or a different gain can be used in this phase. In addition, the input capacitors 204 of the backend ADC circuit 205 do not need to have a capacitance of C.

Figure 3:
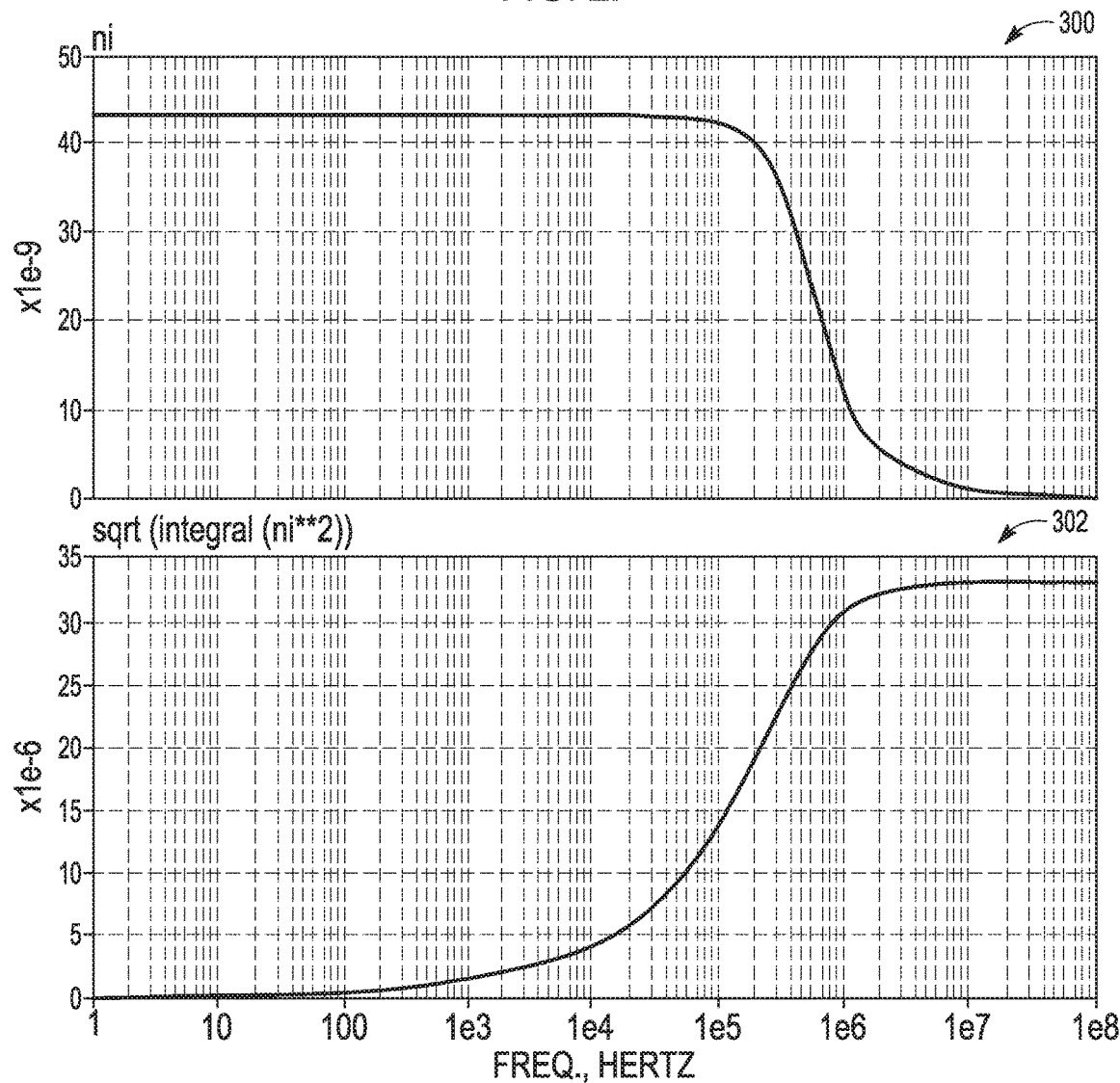
FIG. 3 depicts simulation results using a pipelined ADC circuit that does not implement the techniques of this disclosure.

FIG. 3 depicts simulation results using a pipelined ADC circuit that does not implement the techniques of this disclosure. The top graph 300 depicts the noise spectral density and the bottom graph 302 depicts input referred total noise.

The pipelined ADC circuit included an interstage gain of about 32. As seen in FIG. 3, the input referred total noise is equal to kT/C noise, which is about 32 microvolts (μV). It should be noted that the simulation included only the sampled kT/C noise and other sources of noise were excluded.

Figure 4:
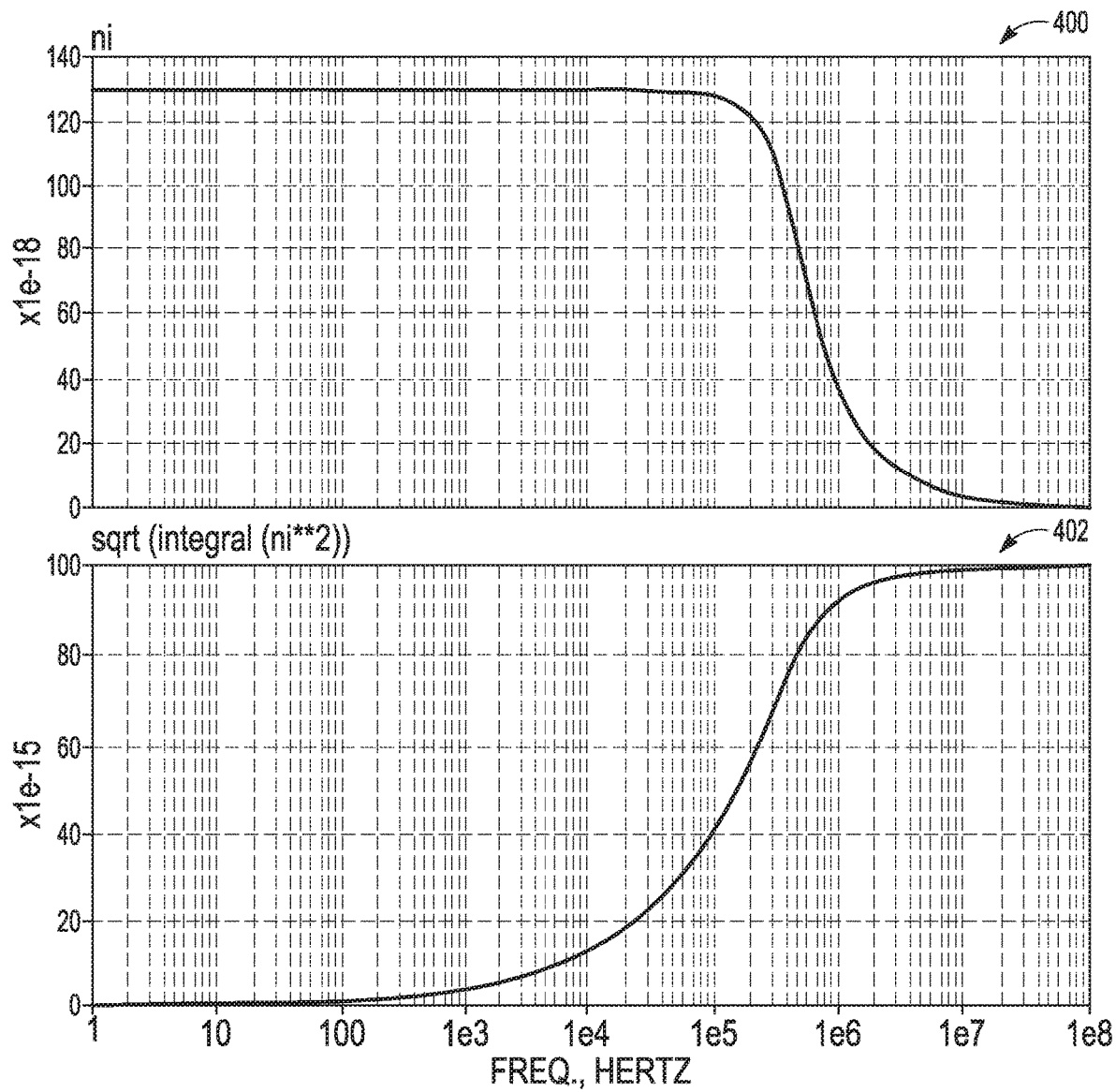
FIG. 4 depicts simulation results using a pipelined ADC circuit that implements various techniques of this disclosure.

FIG. 4 depicts simulation results using a pipelined ADC circuit that implements various techniques of this disclosure. The top graph 400 depicts the noise spectral density and the bottom graph 402 depicts total noise.

The pipelined ADC circuit included an interstage gain of about 32. As seen in FIG. 4, the input referred total noise is only about 100 femtovolts (V). It should be noted that the simulation included only the sampled kT/C noise and other sources of noise were excluded.

Figure 5:
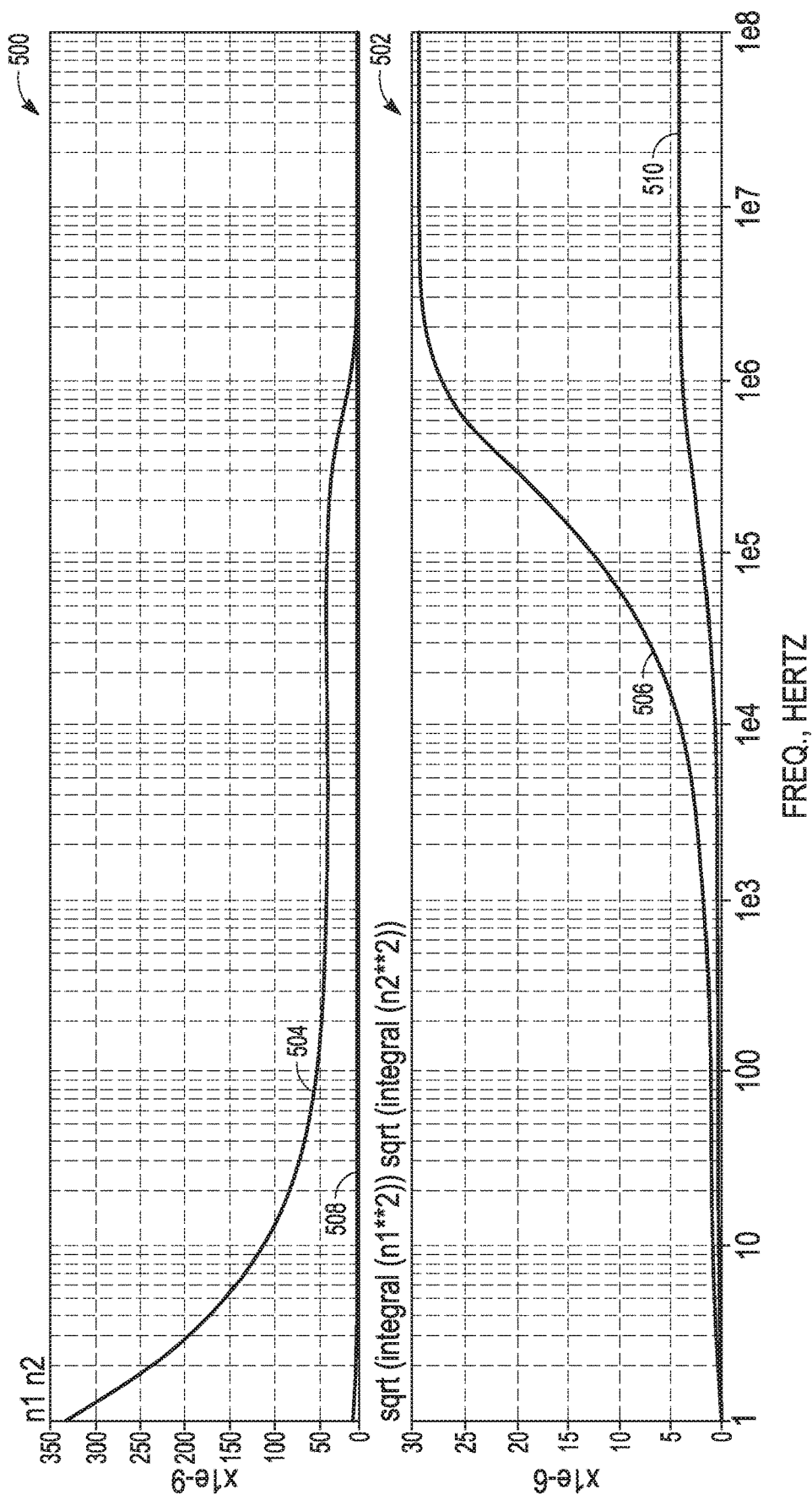
FIG. 5 depicts simulation results using various techniques of this disclosure.

FIG. 5 depicts simulation results using various techniques of this disclosure. All sources of noise were included for these simulation results. The simulation used sampling capacitors having a capacitance of 20 picoFarads (pF), an interstage gain of 64, and a sampling frequency of 1 Ms/sec. The top graph 500 depicts the noise spectral density and the bottom graph 502 depicts total noise.

The traces 504, 506 represent simulation results from a circuit that does not utilize the noise cancellation techniques of this disclosure. The simulated total noise was 29.4 uV.

The traces 508, 510 represent simulation results from a circuit that utilizes the noise cancellation techniques of this disclosure. The simulated total noise was 3.8 uV. As seen in the top graph, the low frequency noise was significantly reduced.

Figure 15:
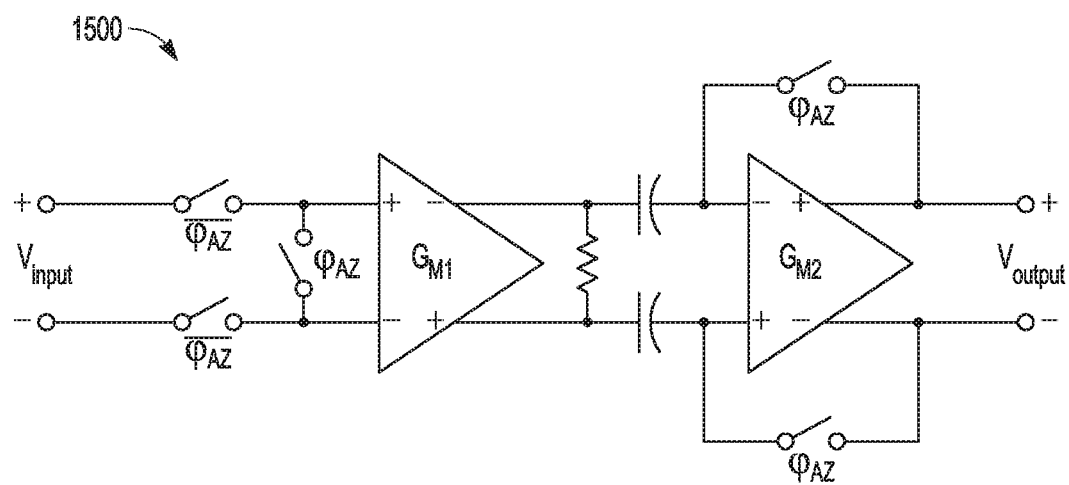
FIG. 15 is a schematic diagram of an example of an amplifier circuit that can implement various techniques of this disclosure.

FIG. 6 is a simplified schematic diagram of an example of a single stage SAR ADC circuit that can implement various techniques of this disclosure. The circuit 600 in FIG. 1, e.g., an integrated circuit, can include a control circuit 102 configured to control switch operation, and an amplifier circuit 104 having inverting and non-inverting inputs coupled to corresponding right-hand side plates of sampling capacitors 106 (each with capacitance Cu). In some examples, the amplifier circuit 104 can be an auto-zero amplifier circuit, such as shown in FIG. 15. Left-hand switches 108 can be coupled to left-hand side plates of the sampling capacitors 106. When the control circuit 102 closes the left-hand switches 108, such as during a sampling phase, the sampling capacitors 106 can receive and store an input signal ($V_{IP}$, $V_{IN}$).

A comparator circuit 602 can be coupled to the top plate nodes 604A, 604B, and the output of the comparator circuit 602 can be coupled to a SAR logic circuit 606 for performing bit trials.

The circuit 600 can include a number of switches, labeled φ1, φ2, and φ3. The φ1 switches can couple the inverting and non-inverting inputs of the amplifier to a common mode voltage $V_{CM}$. The circuit 600 can include noise cancellation capacitors 110A, 110B (each with capacitance C) that can be coupled to inverting and non-inverting outputs of the amplifier circuit 104. In particular, left-hand side plates of the noise cancellation capacitors 110A, 110B can be coupled to inverting and non-inverting outputs of the amplifier circuit 104 using a first pair of φ2 switches and right-hand side plates of the noise cancellation capacitors 110A, 110B can be coupled to the common mode voltage $V_{CM}$ using a second pair of φ2 switches. The right-hand side plates of the noise cancellation capacitors 110A, 110B can also be coupled to φ3 switches, which can couple the noise cancellation capacitors 110A, 110B to the top plate nodes 604B, 604A, respectively, to cancel or reduce a sampled noise.

The control circuit 102 can control the operation of the φ1, 2, and φ3 switches using corresponding φ1, φ2, and φ3 clocks, which are shown graphically at 112. The phases are described in detail above with respect to FIG. 1 and, for purposes of conciseness, will not be described again. The left-hand side plates of the sampling capacitors 106 connect to the input signal when φ2 is in the high state and connect to reference voltages, such as VREF or GND, by the bit trial process when φ3 is in the high state. The ADC circuit 600 of FIG. 6 can convert the input signal value at the falling edge of the φ2 clock to a digital result.

Figure 7:
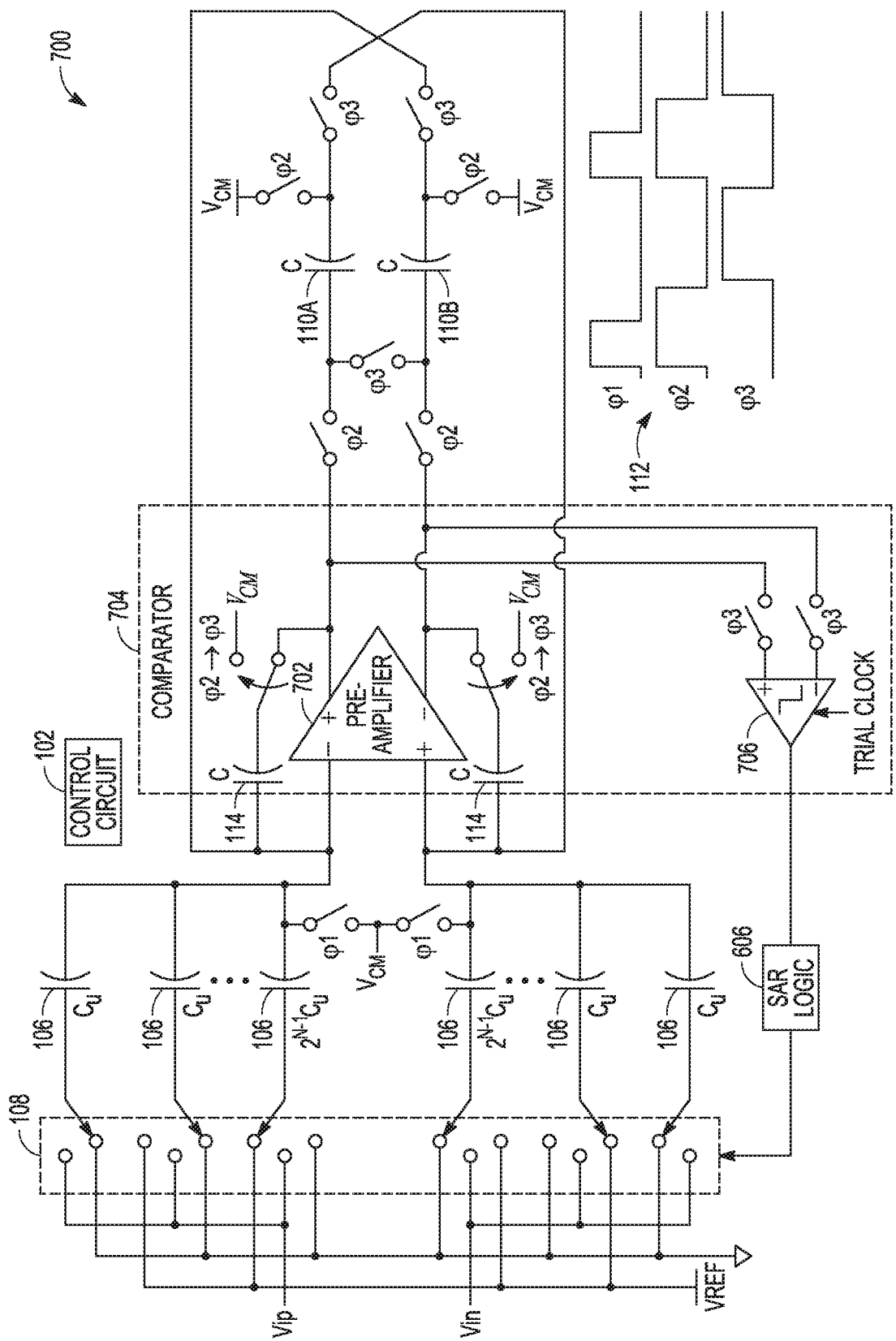
FIG. 7 is a simplified schematic diagram of another example of a single stage SAR ADC circuit that can implement various techniques of this disclosure.

FIG. 7 is a simplified schematic diagram of another example of a single stage SAR ADC circuit 700 that can implement various techniques of this disclosure. In the example shown, the pre-amplifier circuit 702 can form a first part of a comparator circuit 704. By using the configuration shown, the pre-amplifier circuit 702 can be used for comparator purposes and also for noise cancellation purposes, using the techniques described above.

For example, the control circuit 102 can control switch operation to connect the noise cancellation capacitors 110A, 110B back to the inputs of the pre-amplifier circuit 702. After that, the control circuit 102 can control switch operation to reconfigure the pre-amplifier circuit 702 as the first stage of a comparator circuit 704 and bit trials can be performed using the latch circuit 706 coupled to the output of the pre-amplifier circuit 702 and the SAR logic circuit 606. Using this configuration, no second stage backend ADC circuit is needed.

The configuration efficiently reuses the amplifier of a comparator, which is needed for a SAR ADC, to perform the noise cancellation techniques described above.

FIG. 8 is a simplified schematic diagram of another example of a first stage ADC circuit that can implement various techniques of this disclosure. The circuit 800 can include a fast ADC 802, such as a flash ADC, that can be used to quickly generate the first several bits. The results of the fast ADC 802 can be transferred to a DAC function circuit 806, such as to be loaded onto the capacitors 804 of a capacitive DAC function circuit.

When $\varphi 2$ is in the high state, the sampling capacitors 106 (each with a capacitance $C_S$) and the DAC capacitors 804 (each with a capacitance $C_{DAC}$) can be pre-charged to a constant biasing voltage. At the falling edge of $\varphi 2$, the kT/C noise can be copied to the noise cancellation capacitors 110A, 110B.

At the rising edge of $\varphi 3$, the fast ADC 802 can quickly measure the input voltage and send estimated codes to the DAC capacitors 804. Simultaneously, the sampling capacitors 106 can be connected to the input voltage and the noise cancellation capacitors 110A, 110B can be coupled to virtual ground. The difference between the DAC voltage and the input signal can be amplified and sampled by the capacitors 808, which are coupled to the output of the amplifier circuit 104. The capacitors 808 are sampling capacitors for the backend ADC which digitizes the residue voltage sampled by the capacitors 808 to the overall ADC's LSBs.

These backend ADC sampling capacitors 808 and the DAC capacitors 804 can also be used in other type of ADCs, such as delta sigma ADCs, pipelined ADCs, and SAR ADCs, and different amplifier circuits can be used for signal path or noise cancellation purposes.

Figure 9:
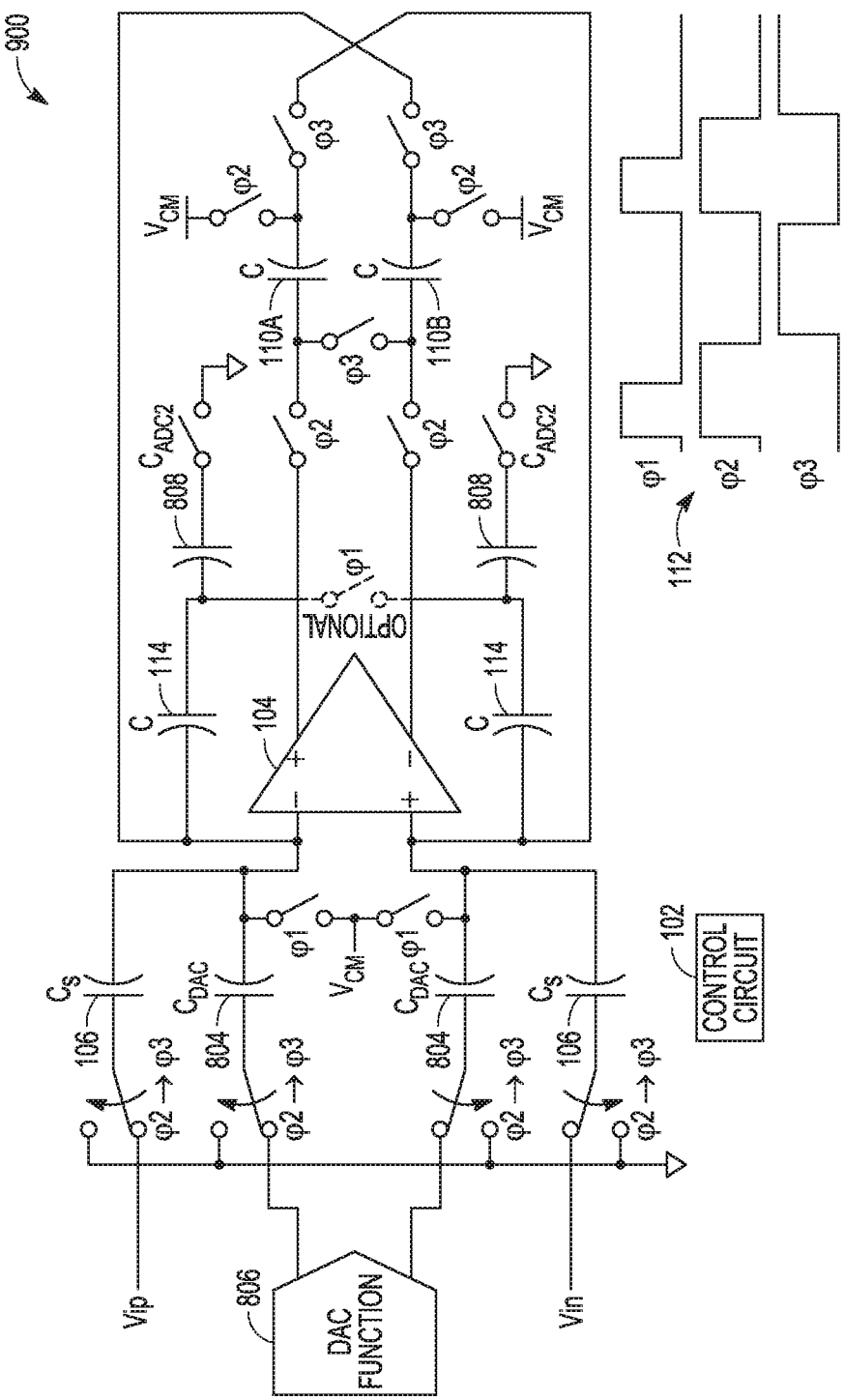
FIG. 9 is a simplified schematic diagram of another example of a first stage ADC circuit that can implement various techniques of this disclosure.

FIG. 9 is a simplified schematic diagram of another example of a first stage ADC circuit that can implement various techniques of this disclosure. During the sampling phase, the input signal can be sampled onto the sampling capacitors 106. In addition, a predicted DAC code can be sampled onto the DAC capacitors 804. That is, the input signal can be predicted, such as by a fast ADC, and then the DAC capacitors 804 can be pre-charged to a DAC value based on the predicted values, either close to the opposite of the signal, or other value.

Next, the left-hand side plate of a sampling capacitor 106 can be shorted to a left-hand side plate of a corresponding DAC capacitor 804 to generate a residue voltage. The residue voltage can be amplified by the gain stage of the amplifier circuit 104. Then, when $\varphi 3$ is in the high state, the sampling capacitors 106, the DAC capacitors 804, and the noise cancellation capacitors 110A, 110B can be combined for further processing and noise cancellation.

FIG. 10 is a simplified schematic diagram of an example of a gain stage circuit that can implement various techniques of this disclosure. In the circuit 1000, the left-hand side plates of the sampling capacitors 106 (each of with capacitance $C_S$) are initially coupled to a common-mode voltage $V_{CM}$, and the input signal is sampled against the common-mode voltage $V_{CM}$. Then, the control circuit 102 can control switch operation to perform the noise cancellation techniques described above. Finally, the sampling capacitors 106 can be connected to the input signals $V_{IP}$ and $V_{IN}$. The difference between the input signals $V_{IP}$ and $V_{IN}$ and the common-mode voltage $V_{CM}$ will be gained up by the capacitive gain stage shown in FIG. 10 after the sampled kT/C noise has been canceled.

As seen in the configuration shown in FIG. 10, $\varphi 1$ switches can be included between the inputs and the outputs of the amplifier circuit 104. By using these $\varphi 1$ switches, the right-hand side plates of the sampling capacitors 106 can be set equal to the output common mode voltage of the amplifier circuit 104 to perform an autozero of the amplifier circuit 104 and set the bias voltage at the amplifier's inputs.

FIG. 11 is a simplified schematic diagram of another example of a gain stage circuit that can implement various techniques of this disclosure. The circuit 1100 of FIG. 11 can operate similar to the circuit 1000 of FIG. 10. In FIG. 11, however, el switches can be included between the inputs of the amplifier circuit 104. By using these el switches, the right-hand side plates of the sampling capacitors 106 can be shorted to the common-mode voltage $V_{CM}$ to perform an autozero of the amplifier circuit 104.

Although the noise cancellation techniques were described above with respect to various differential configurations, the techniques are not limited to differential configurations. Rather, single-ended configurations can also be used to perform the noise cancellation techniques, such as described below with respect to FIGS. 12-14.

FIG. 12 is a simplified schematic diagram of an example of a single-ended circuit that can implement various techniques of this disclosure. The circuit 1200 in FIG. 12, e.g., an integrated circuit, can include a control circuit 102 configured to control switch operation, and an amplifier circuit 1202 having inverting and non-inverting inputs. The non-inverting input can be coupled to a common-mode voltage $V_{CM}$, and the inverting input can be coupled to the right-hand side plate of a sampling capacitor 106 (with capacitance $C_S$). In some examples, the amplifier circuit 104 can be an auto-zero amplifier circuit.

Left-hand switches 108 can be coupled to a left-hand side plate of the sampling capacitor 106. When the control circuit 102 closes the left-hand switches 108, such as during a sampling phase, the sampling capacitor 106 can receive and store a voltage.

The circuit 1200 can include a number of additional switches, labeled $\varphi 1$, $\varphi 2$, and $\varphi 3$. The $\varphi 1$ switches can couple the inverting input of the amplifier to the common mode voltage $V_{CM}$. The circuit 1200 can include a noise cancellation capacitor 110 (with capacitance C) that can be coupled to the output of the amplifier circuit 1202. In particular, the left-hand side plate of the noise cancellation capacitor 110 can be coupled to the output of the amplifier circuit 104 using a $\varphi 2$ switch and to the inverting input of the amplifier using a $\varphi 3$ switch, which can couple the noise cancellation capacitor 110 to the sampling capacitor 106 to cancel or reduce a sampled noise.

The control circuit 102 can control the operation of the $\varphi 1$, 2, and $\varphi 3$ switches using corresponding $\varphi 1$, $\varphi 2$, and $\varphi 3$ clocks, which are shown graphically at 112. The first phase is when φ1 is in the high state, which can represent a sampling phase of the sampling capacitors 106. The second phase is after φ1 transitions to the low state and before φ2 transitions to the low state. The second phase can represent a transfer phase in which the sampled noise stored on the sampling capacitors 106 can be amplified and sampled by the corresponding noise cancellation capacitor 110. The third phase is after φ2 transitions to the low state and when φ3 is the high state. The third phase represents a cancellation phase in which the noise cancellation capacitors can be coupled to the corresponding sampling capacitor to reduce or cancel the sampled noise.

As seen at 112, in some examples, the control circuit 102 can close both the φ1 and φ2 switches, open the φ1 switches, open the φ2 switches after the φ1 switches, close the φ3 switches, and then open the 93 switches. In other examples, the control circuit can close the φ2 switches after the φ1 switches are opened, as shown by the dashed line in the φ2 phase, such that the φ2 switches do not overlap with the φ1 switches.

The circuit 1200 can include one or more optional components, which are shown in dashed line. For example, the amplifier circuit 1202 can be arranged in a negative-feedback configuration, such as by using an optional feedback capacitor 114 (with capacitance C). In some implementations, the negative-feedback configuration can control an overall voltage gain of the integrated circuit, such as a voltage gain of $-C_S/C$ in the example shown.

Without being bound by theory, the noise cancellation operation for the single-ended configuration shown in FIG. 12 will now be described. For simplicity and for purposes of explanation only, assume that the left-hand side of the sampling capacitor 106 is connected to 0 volts all the time. At the falling edge of φ1, the control circuit 102 opens the φ1 sampling switch and the sampled noise charge $Q_{KTC}$ is frozen on the top plate node 1204.

At the falling edge of φ2, the control circuit 102 opens the φ2 sampling switch and a φ2 noise voltage of $-Q_{KTC}/C+V_N$ appears at the output of the amplifier circuit 1202. In addition, a noise charge of $-Q_{KTC}+V_N*C$ is copied to the left-hand side plate of the noise cancellation capacitor 110. As described above, every time a sample is taken, some thermal noise is also sampled, which is represented by $V_N*C$.

During the third phase, the control circuit 102 closes the φ3 switch, which connects the left-hand side of capacitor 110 to the inverting input of the amplifier 1202, thereby combining the noise charge of $-Q_{KTC}+V_N*C$ on the left-hand side plate of the noise cancellation capacitor 110 with the sampled noise charge of $Q_{KTC}$ on the top plate node 1204. The original noise charge of $Q_{KTC}$ is cancelled, leaving only the thermal noise charge term $V_N*C$.

FIG. 13 is a simplified schematic diagram of another example of a single-ended circuit that can implement various techniques of this disclosure. When compared with the single-ended configuration 1200 shown in FIG. 12, the circuit 1300 of FIG. 13 includes an inverter 1302, an additional φ2 switch, and an additional φ3 switch. The φ3 switch of FIG. 12 is now coupled to the right-hand side plate of the noise cancellation capacitor 110 and to an input of the inverter 1302. The output of the inverter 1302 is coupled to the top plate node 1204.

The additional φ2 switch is coupled between the left-hand side plate of the noise cancellation capacitor 110 and the common mode voltage $V_{CM}$, and the additional φ3 switch is coupled between the right-hand side plate of the noise cancellation capacitor 110 and the common mode voltage $V_{CM}$.

The inclusion of the inverter 1302 allows the control circuit 102 to control a switch operation similar to that of the differential configurations described above. In the differential configuration, the right-hand side plate of the noise cancellation capacitor is coupled to the non-inverting terminal of the amplifier circuit, which is not possible in the single-ended configuration of FIG. 13 due to its connection to the common mode voltage. Thus, an inverter 1302 with a voltage gain of −1 can be used to couple the right-hand side plate of the noise cancellation capacitor 110 to the inverting terminal of the amplifier circuit 1202, as shown in FIG. 13. Coupling the right-hand side plate of the noise cancellation capacitor 110 to the inverting terminal of the amplifier circuit 1202 without using the inverter 1302 would double the kT/C noise. By including the inverter 1302, the kT/C noise $Q_{KTC}$ can be canceled.

FIG. 14 is a simplified schematic diagram of another example of a single-ended circuit that can implement various techniques of this disclosure. In the circuit 1400 shown in FIG. 14, the non-inverting input of the amplifier circuit 1202 is not directly connected to the common-mode voltage $V_{CM}$, in contrast to the configurations shown in FIGS. 12 and 13. Instead, a sampling capacitor 106 can be coupled to the non-inverting input of the amplifier circuit, and the top plate node 1402A and the top plate node 1402B can each be coupled to the common-mode voltage $V_{CM}$ via corresponding φ1 switches. In the configuration of FIG. 14, the common-mode voltage $V_{CM}$ can be sampled. Because the non-inverting input of the amplifier circuit 1202 is floating, the right-hand side plate of the noise cancellation capacitor 110 can be coupled to the non-inverting terminal of the amplifier circuit 1202 through a φ3 switch.

FIG. 15 is a schematic diagram of an example of an amplifier circuit that can implement various techniques of this disclosure. The amplifier circuit 1500 of FIG. can be used as the amplifier circuit 104 of FIGS. 6-9 and FIG. 11. The amplifier circuit 1500 can be an auto-zero amplifier circuit.

By using various techniques describe above, the kT/C noise can be canceled or reduced directly before the gain stage. This is in contrast to other techniques that can cancel or reduce the kT/C noise indirectly after the gain stage.

Notes

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An integrated circuit configured to reduce or cancel a sampled noise during a sampling phase, the integrated circuit comprising:

a sampling capacitor configured to store a voltage during the sampling phase, wherein the noise is also stored on the sampling capacitor;

an amplifier circuit having an input and an output, wherein the input is configured to be coupled to the sampling capacitor;

a noise cancellation capacitor configured to be coupled to the output of the amplifier circuit, wherein the amplifier circuit is configured to transfer the sampled noise stored on the sampling capacitor to the noise cancellation capacitor; and a control circuit configured to control switch operation to couple the noise cancellation capacitor to the sampling capacitor to reduce or cancel the sampled noise, wherein the control circuit is configured to control switch operation using three phases, and wherein the three phases include:

a first phase representing the sampling phase of the sampling capacitor;

a second phase representing a transfer phase in which the sampled noise stored on the sampling capacitor is amplified and sampled by the noise cancellation capacitor; and a third phase representing a cancellation phase in which the noise cancellation capacitor is coupled to the sampling capacitor to reduce or cancel the sampled noise.

2. The integrated circuit of claim 1, wherein the sampling capacitor is coupled to a signal during at least one of the first, second, and third phases.

3. The integrated circuit of claim 1, wherein the control circuit is configured to disconnect the noise cancellation capacitor from the output of the amplifier circuit.

4. The integrated circuit of claim 1, wherein the sampling capacitor is a first sampling capacitor, and wherein the noise cancellation capacitor is a first noise cancellation capacitor, the integrated circuit comprising:

a second sampling capacitor; and a second noise cancellation capacitor, and wherein the control circuit is configured to control operation of a plurality of switches to:

couple the first noise cancellation capacitor to the second sampling capacitor and the second noise cancellation capacitor to the first sampling capacitor to cancel or reduce the sampled noise.

5. The integrated circuit of claim 1, wherein the integrated circuit forms part of an analog-to-digital converter (ADC) circuit.

6. The integrated circuit of claim 1, wherein the integrated circuit forms part of a gain stage.

7. The integrated circuit of claim 1, wherein the amplifier circuit is a pre-amplifier stage of a comparator circuit.

8. The integrated circuit of claim 1, in combination with a back-end analog-to-digital converter circuit.

9. The integrated circuit of claim 1, wherein the amplifier circuit is arranged in an open loop configuration.

10. The integrated circuit of claim 1, wherein the amplifier circuit is arranged in a negative-feedback configuration.

11. The integrated circuit of claim 10, wherein the negative-feedback configuration controls an overall gain of the integrated circuit.

12. A method to reduce or cancel a sampled noise during a sampling phase, the method comprising:

storing, during a first phase, a voltage during the sampling phase, wherein the sampled noise is also stored on a sampling capacitor;

transferring, during a second phase, the sampled noise stored on the sampling capacitor to a noise cancellation capacitor; and coupling, during a third phase, the noise cancellation capacitor to the sampling capacitor to reduce or cancel the sampled noise.

13. The method of claim 12, comprising:
disconnecting the noise cancellation capacitor from an output of an amplifier circuit.

14. The method of claim 12, wherein the sampling capacitor is a first sampling capacitor, and wherein the noise cancellation capacitor is a first noise cancellation capacitor, the method comprising:
coupling the first noise cancellation capacitor to the second sampling capacitor and the second noise cancellation capacitor to the first sampling capacitor to cancel or reduce the sampled noise.

15. The method of claim 12, comprising:
after canceling or reducing the sampled noise, performing an analog-to-digital conversion.

16. The method of claim 12, comprising:
coupling the sampling a capacitor to a signal during at least one of the first, second, and third phases.

17. An integrated circuit configured to reduce or cancel a sampled noise during a sampling phase, the integrated circuit comprising:
means for storing, during a first phase, a voltage during the sampling phase, wherein the sampled noise is also stored on a sampling capacitor;
means for transferring, during a second phase, the sampled noise stored on the sampling capacitor to a noise cancellation capacitor; and
means for coupling, during a third phase, the noise cancellation capacitor to the sampling capacitor to reduce or cancel the sampled noise.

18. The integrated circuit of claim 17, wherein the integrated circuit forms part of a gain stage.

19. The integrated circuit of claim 17, wherein the amplifier circuit is a pre-amplifier stage of a comparator circuit.

20. An integrated circuit configured to reduce or cancel a sampled noise during a sampling phase, the integrated circuit comprising:
a first sampling capacitor configured to store a voltage during the sampling phase, wherein the noise is also stored on the first sampling capacitor;
a second sampling capacitor;
an amplifier circuit having an input and an output, wherein the input is configured to be coupled to the first sampling capacitor, and wherein the amplifier circuit is configured to transfer the sampled noise stored on the first sampling capacitor;
a first noise cancellation capacitor configured to be coupled to the output of the amplifier circuit;
a second noise cancellation capacitor; and
a control circuit configured to control switch operation of a plurality of switches to couple the first noise cancellation capacitor to the second sampling capacitor and the second noise cancellation capacitor to the first sampling capacitor to cancel or reduce the sampled noise.

21. The integrated circuit of claim 20, wherein the integrated circuit forms part of an analog-to-digital converter (ADC) circuit.

22. The integrated circuit of claim 20, wherein the integrated circuit forms part of a gain stage.

23. The integrated circuit of claim 20, wherein the amplifier circuit is a pre-amplifier stage of a comparator circuit.

24. The integrated circuit of claim 20, wherein the amplifier circuit is arranged in an open loop configuration.

25. The integrated circuit of claim 20, wherein the amplifier circuit is arranged in a negative-feedback configuration.

* * * * *

UNITED STATES PATENT AND TRADEMARK OFFICE
CERTIFICATE OF CORRECTION

PATENT NO. : 11,108,404 B1  
APPLICATION NO. : 16/935920  
DATED : August 31, 2021  
INVENTOR(S) : Hongxing Li Page 1 of 1

It is certified that error appears in the above-identified patent and that said Letters Patent is hereby corrected as shown below:

On the Title Page

In Column 2, under "Other Publications", Line 6, delete "Noice" and insert --Noise-- therefor Signed and Sealed this  
Seventh Day of December, 2021

Drew Hirshfeld  
*Performing the Functions and Duties of the*  
*Under Secretary of Commerce for Intellectual Property and*  
*Director of the United States Patent and Trademark Office*